(12) United States Patent
Maegawa (10) Patent No.: US 11,917,757 B2
(45) Date of Patent: Feb. 27, 2024

(54) CIRCUIT BOARD

(71) Applicant: Murata Manufacturing Co., Ltd., Nagaokakyo (JP)

(72) Inventor: Hiroki Maegawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 92 days.

(21) Appl. No.: 17/495,851

(22) Filed: Oct. 7, 2021

(65) Prior Publication Data

US 2022/0030712 A1    Jan. 27, 2022

Related U.S. Application Data

(63) Continuation of application No. PCT/JP2020/023251, filed on Jun. 12, 2020.

(30) Foreign Application Priority Data

Jul. 9, 2019  (JP) .................................. 2019-127620

(51) Int. Cl.
*H05K 1/11*  (2006.01)
*H05K 1/18*  (2006.01)
(Continued)

(52) U.S. Cl.
CPC .............. *H05K 1/112* (2013.01); *H05K 1/181* (2013.01); *H05K 1/183* (2013.01); *H05K 3/0058* (2013.01);
(Continued)

(58) Field of Classification Search
CPC ........ H05K 1/112; H05K 3/0058; H05K 3/28; H05K 2201/09472; H05K 2203/1377;
(Continued)

(56) References Cited

U.S. PATENT DOCUMENTS 6,324,067 B1 * 11/2001 Nishiyama ............. H05K 1/183
428/209
9,258,897 B2 * 2/2016 Ishihara ................. H05K 1/183
(Continued)

FOREIGN PATENT DOCUMENTS

JP    2002-158445 A    5/2002
JP    2007-142188 A    6/2007
(Continued)

OTHER PUBLICATIONS

Official Communication issued in International Patent Application No. PCT/JP2020/023251, dated Sep. 1, 2020.

*Primary Examiner* — Ishwarbhai B Patel
(74) *Attorney, Agent, or Firm* — Keating & Bennett, LLP (57) ABSTRACT

A circuit board includes a substrate including first and second sections with different thicknesses, a protective layer, and mounting electrodes. The substrate includes a step surface connecting a first principal surface of the first section and a first principal surface of the second section. The mounting electrodes are on the first principal surface corresponding to an element to be mounted. The protective layer is disposed over the first principal surface, the step surface, and the first principal surface. The separation distance between the mounting electrode and the step surface is greater than or equal to the terminal-to-terminal distance between the mounting electrode and the mounting electrode.

18 Claims, 7 Drawing Sheets

(51) Int. Cl.
*H05K 3/00* (2006.01)
*H05K 3/28* (2006.01)

(52) U.S. Cl.
CPC ..... *H05K 3/28* (2013.01); *H05K 2201/09472* (2013.01); *H05K 2203/1377* (2013.01)

(58) Field of Classification Search
CPC ............ H05K 2203/168; H05K 1/111; H05K 1/0284; Y02P 70/50; H01L 25/04; H01L 25/18
See application file for complete search history.

(56) References Cited

U.S. PATENT DOCUMENTS

2001/0010303 A1* 8/2001 Caron ................. H05K 3/4691
 216/36
2007/0117261 A1 5/2007 Ueno et al.
2008/0049405 A1* 2/2008 Sahara ................ H05K 3/4697
 29/830

FOREIGN PATENT DOCUMENTS

| JP | 2007-266195 A | 10/2007 |
| JP | 2009-218319 A | 9/2009 |
| JP | 2014-192407 A | 10/2014 |

\* cited by examiner

CIRCUIT BOARD

CROSS REFERENCE TO RELATED APPLICATIONS

This application claims the benefit of priority to Japanese Patent Application No. 2019-127620 filed on Jul. 9, 2019 and is a Continuation Application of PCT Application No. PCT/JP2020/023251 filed on Jun. 12, 2020. The entire contents of each application are hereby incorporated herein by reference.

BACKGROUND OF THE INVENTION

1. Field of the Invention

The present invention relates to a circuit board including a cavity with a bottom at which a plurality of mounting electrodes are disposed.

2. Description of the Related Art

Japanese Unexamined Patent Application Publication No. 2007-142188 discloses a multilayer printed wiring board. The multilayer printed wiring board described in Japanese Unexamined Patent Application Publication No. 2007-142188 includes a thinner flexible portion and a thicker rigid portion. A step is present between a first principal surface of the flexible portion and a first principal surface of the rigid portion. That is, the multilayer printed wiring board described in Japanese Unexamined Patent Application Publication No. 2007-142188 includes a cavity whose bottom is the first principal surface of the flexible portion.

The multilayer printed wiring board described in Japanese Unexamined Patent Application Publication No. 2007-142188 includes a covering layer. The covering layer is disposed over the first principal surface of the flexible portion, the step surface, and the first principal surface of the hard portion.

Depending on the method for forming the covering layer, however, the height of the surface of the covering layer may be different between that in a position near the step surface and that in a position far from the step surface in the first principal surface of the flexible portion (bottom of the cavity). For example, if a cover lay for forming the covering layer does not follow the step or the thickness of liquid applied for forming the covering layer is made uneven by the effect of the step, the height of the covering layer may be different. If a plurality of mounting electrodes are disposed on the principal surface covered with that covering layer and an opening through which the plurality of mounting electrodes is exposed is disposed, the distances between the plurality of mounting electrodes and terminals mounted on the mounting electrodes may be different depending on the difference in the height of the covering layer, and a defect in mounting may occur.

SUMMARY OF THE INVENTION

Accordingly, preferred embodiments of the present invention provide circuit boards each including a cavity with a bottom surface at which mounting electrodes are disposed and each of which are able to reduce or prevent defects in mounting when the cavity is overlaid with a protective layer defining a covering layer.

A circuit board according to a preferred embodiment of the present invention includes a substrate including an insulating material, a plurality of mounting electrodes, and a protective layer. The substrate includes a first section and a second section each including a first principal surface, positions of the first principal surfaces of the first and second sections being different in a thickness direction, and a step surface provided by a difference between the position of the first principal surface of the first section and the position of the first principal surface of the second section in the thickness direction and exposed toward the first principal surface of the first section. The plurality of mounting electrodes include a group of mounting electrodes to mount a component. The group of mounting electrodes is on the first principal surface of the first section corresponding to an arrangement of terminals of the component. The protective layer is disposed over the first principal surface of the first section, the step surface, and the first principal surface of the second section. For two mounting electrodes in the group of mounting electrodes, a separation distance between one of the two mounting electrodes nearer the step surface and the step surface is greater than or equal to a distance between the two mounting electrodes.

In this configuration, because the separation distance can be provided, the difference between the thicknesses of the protective layer in positions where the two mounting electrodes are provided is small.

According to preferred embodiments of the present invention, when the cavity with the bottom surface at which the mounting electrodes are disposed is included and the cavity is overlaid with the protective layer, defects in mounting can be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings.

First Preferred Embodiment

Figure 1A:
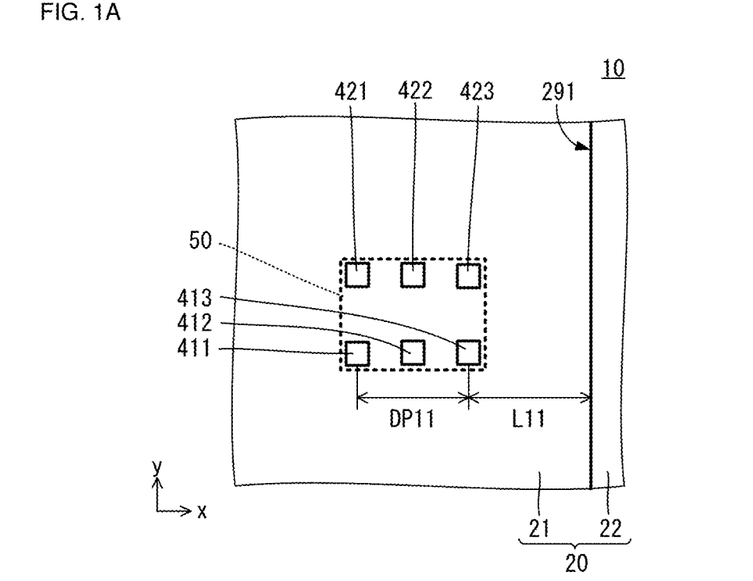
FIG. 1A is a partial plan view of a circuit board according to a first preferred embodiment of the present invention.
Figure 1B:
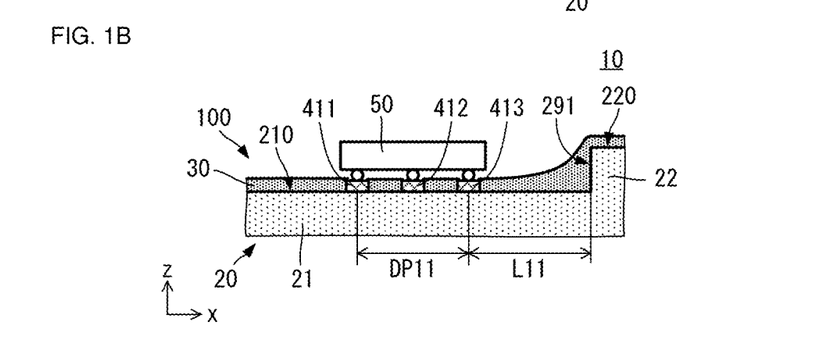
FIG. 1B is a partial side cross-sectional view of the circuit board according to the first preferred embodiment of the present invention.
Figure 1C:
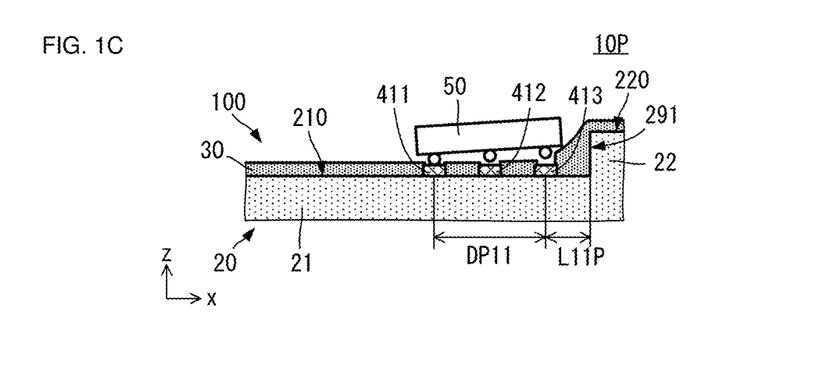
FIG. 1C is a partial side cross-sectional view of a circuit board according to a comparative example.

A circuit board according to a first preferred embodiment of the present invention is described with reference to the drawings. FIG. 1A is a partial plan view that schematically illustrates a configuration of the circuit board according to the first preferred embodiment. FIG. 1B is a partial side cross-sectional view that schematically illustrates the configuration of the circuit board according to the first preferred embodiment. FIG. 1C is a partial side cross-sectional view that schematically illustrates a configuration of a circuit board according to a comparative example. When the circuit board includes the portion illustrated in FIGS. 1A and 1B, the configuration of the other portions can be determined as appropriate based on a circuitry configuration of an electronic circuit achieved by the circuit board. Accordingly, the description of the configuration of the other portions is omitted.

As illustrated in FIGS. 1A and 1B, a circuit board 10 includes a substrate 20, a protective layer 30, a mounting electrode 411, a mounting electrode 412, a mounting electrode 413, a mounting electrode 421, a mounting electrode 422, and a mounting electrode 423. Hereinafter, the mounting electrode 411, mounting electrode 412, mounting electrode 413, mounting electrode 421, mounting electrode 422, and mounting electrode 423 are referred to as the plurality of mounting electrodes 411 to 423 when they can be collectively described.

An example of the substrate 20 may including laminated insulating layers. The substrate 20 includes a first section 21 and a second section 22 having different thicknesses. Specifically, the second section 22 is thicker than the first section 21. That difference in the thickness results from the difference in the number of the insulating layers that are laminated. That is, the number of the insulating layers of the second section 22 is larger than the number of the insulating layers of the first section 21. An example of this configuration can be achieved by laminating an insulating layer including an opening on an insulating layer not including an opening.

Because the first section 21 and second section 22 have the different thicknesses, the position of a first principal surface 210 of the first section 21 and the position of a first principal surface 220 of the second section 22 in the thickness direction of the substrate 20 (z direction) are different. That positional difference provides a step surface 291.

The step surface 291 connects with the first principal surface 210 of the first section 21 and the first principal surface 220 of the second section 22. The step surface 291 is perpendicular or substantially perpendicular to the first principal surface 210 of the first section 21 and the first principal surface 220 of the second section 22. Because the second section 22 is thicker than the first section 21, the step surface 291 is exposed toward the first principal surface 210. In the present preferred embodiment, the first section 21 and the second section 22 are aligned in the x direction, and thus the step surface 291 is a plane perpendicular or substantially perpendicular to the x direction (plane parallel or substantially parallel with the y direction and the z direction). The step surface 291 may not be exactly perpendicular to the first principal surface 210 of the first section 21 or the first principal surface 220 of the second section 22.

In this configuration, the circuit board 10 includes a cavity 100. The step surface 291 is a side of the cavity 100, and the first principal surface 210 of the first section 21 is a bottom surface of the cavity 100.

The plurality of mounting electrodes 411 to 423 are disposed on the first principal surface 210 of the first section 21, that is, the bottom surface of the cavity 100. Although not illustrated, the plurality of mounting electrodes 411 to 423 is connected to a circuit electrode pattern disposed on the substrate 20 as appropriate in accordance with a circuitry configuration of an electronic circuit achieved by the circuit board 10.

The plurality of mounting electrodes 411 to 423 are arranged on the first principal surface 210 of the first section 21 corresponding to the arrangement of terminal electrodes of an electronic component 50 to be mounted on the plurality of mounting electrodes 411 to 423. That is, the plurality of mounting electrodes 411 to 423 corresponds to a group of mounting electrodes. Specifically, in the present preferred embodiment, the terminal electrodes of the electronic component 50 are arranged in a two-by-three matrix, for example. Therefore, the mounting electrodes 411, 412, and 413 are aligned in a row, and the mounting electrodes 421, 422, and 423 are aligned in a row. In the present preferred embodiment, as illustrated in FIGS. 1A and 1B, those rows are parallel or substantially parallel with the x direction. The mounting electrodes 411 and 421 are aligned in a row, the mounting electrodes 412 and 422 are aligned in a row, and the mounting electrodes 413 and 423 are aligned in a row. In the present preferred embodiment, those rows are parallel or substantially parallel with the y direction.

The protective layer 30 is made of an insulating material and is film-shaped. The protective layer 30 extends over the first principal surface 210 of the first section 21, the step surface 291, and the first principal surface 220 of the second section 22 and covers those surfaces. The protective layer 30 includes openings to expose the plurality of mounting electrodes 411 to 423 therethrough.

The plurality of terminal electrodes of the electronic component 50 are joined to the plurality of mounting electrodes 411 to 423 by a conductive binder or the like, such as solder, for example.

In this configuration, for example, when the protective layer 30 is produced by the application and solidification of a resist liquid or the like having fluidity, as illustrated in FIGS. 1B and 1C, the height of the surface of the protective layer 30 at a position near the step surface 291 and that at a position far from the step surface 291 are different. Even if the protective layer 30 is formed by another method, such a difference in the height of the surface of the protective layer 30 may also be present. When that difference in the height of the surface of the protective layer 30 is present, an issue illustrated in FIG. 1C arises.

As illustrated in FIG. 1C, when the mounting electrode 413 is at a position near the step surface 291 (distance L11P<L11), the difference between the surface of the protective layer 30 and the surface of the mounting electrode 413 at the location of the mounting electrode 413 is larger than the difference between the surface of the protective layer 30 and the surface of the mounting electrode 411 at the location of the mounting electrode 411. Therefore, for example, as illustrated in FIG. 1C, the corner of the electronic component 50 on its back side near the step surface 291 comes into contact with the protective layer 30, and the electronic component 50 is mounted in a tilted state. Thus, the distance between the terminal electrode of the electronic component 50 and each of the mounting electrodes 413 and 412 increases, and the terminal electrodes may be unable to be securely joined to the mounting electrodes 413 and 412.

To address this issue, the relationship between the step surface 291 and the plurality of mounting electrodes 411 to 423 in the circuit board 10 in the present preferred embodiment is specified as described below.

As illustrated in FIGS. 1A and 1B, because the step surface 291 is parallel or substantially parallel with the y direction, the mounting electrodes nearest the step surface 291 in the plurality of mounting electrodes 411 to 423 are the mounting electrode 413 (an example of a first mounting electrode) and the mounting electrode 423. Here, the separation distance L11 between the mounting electrode 413 and the step surface 291 is the same or substantially the same as the separation distance between the mounting electrode 423 and the step surface 291. Accordingly, the separation distance L11 is specified.

On the line specifying the separation distance L11 between the mounting electrode 413 and the step surface 291, the mounting electrode farthest from the mounting electrode 413 is the mounting electrode 411 (an example of a second mounting electrode). The distance between the two mounting electrodes 411 and 413 is defined as the terminal-to-terminal distance DP11.

Here, when the separation distance L11 is greater than or equal to the terminal-to-terminal distance DP11, the difference in the thickness of the protective layer 30 can be reduced or prevented to an allowable level for mounting. Accordingly, when the step surface 291 is arranged such that the separation distance L11 is greater than or equal to the terminal-to-terminal distance DP11, defects in mounting can be reduced or prevented.

In the above description, the separation distance L11 is greater than or equal to the terminal-to-terminal distance DP11. In consideration of miniaturization of the circuit board 10, the difference between the separation distance L11 and the terminal-to-terminal distance DP11 may preferably be small, and more preferably, they may be the same or substantially the same.

The separation distance L11 may preferably be greater than or equal to the height of the step surface 291, which is one end of that separation distance L11. Thus, defects in mounting can be further reduced or prevented.

In the above description, the configuration including the single set of the mounting electrodes 411 to 423 to mount the single electronic component 50 is described as an example. In the first preferred embodiment, however, a plurality of electronic components may be mounted, as illustrated in a fifth preferred embodiment described below. In that case, when all of the sets of mounting electrodes for all of the electronic components disposed on the substrate 20 satisfy the above-described conditions, defects in mounting can be reduced or prevented.

Second Preferred Embodiment

Figure 2A:
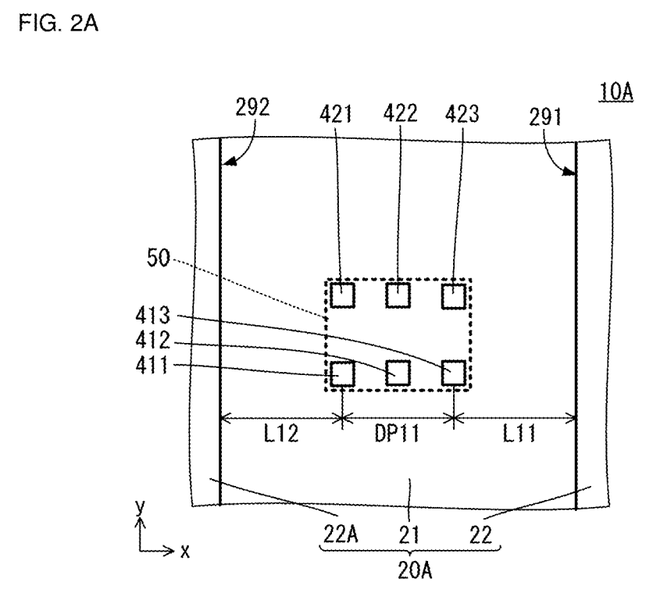
FIG. 2A is a partial plan view of a circuit board according to a second preferred embodiment of the present invention.
Figure 2B:
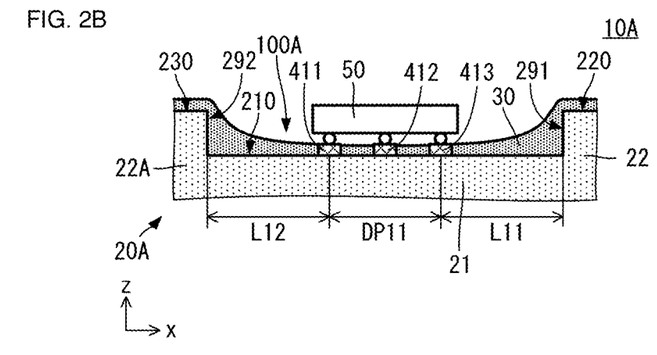
FIG. 2B is a partial side cross-sectional view of the circuit board according to the second preferred embodiment of the present invention.

A circuit board according to a second preferred embodiment of the present invention is described with reference to the drawings. FIG. 2A is a partial plan view of the circuit board according to the second preferred embodiment. FIG. 2B is a partial side cross-sectional view of the circuit board according to the second preferred embodiment.

As illustrated in FIGS. 2A and 2B, a circuit board 10A according to the second preferred embodiment differs from the circuit board 10 according to the first preferred embodiment in the configuration of a substrate 20A. The remaining configuration of the circuit board 10A is the same as or similar to that of the circuit board 10, and the description of the same or similar portions is omitted.

The substrate 20A differs from the substrate 20 in that it further includes a second section 22A and a cavity 100A. The second section 22A is connected to an end of the first section 21 opposite to the end connected to the second section 22. The height of the second section 22A is the same or substantially the same as that of the second section 22. A step surface 292 is provided by the second section 22A and the first section 21.

In this configuration, similar to the separation distance L11, the separation distance L12 between the mounting electrode 411 and the step surface 292 is greater than or equal to the terminal-to-terminal distance DP11.

With that configuration, similar to the circuit board 10, the circuit board 10A can reduce or prevent defects in mounting.

Third Preferred Embodiment

Figure 3:
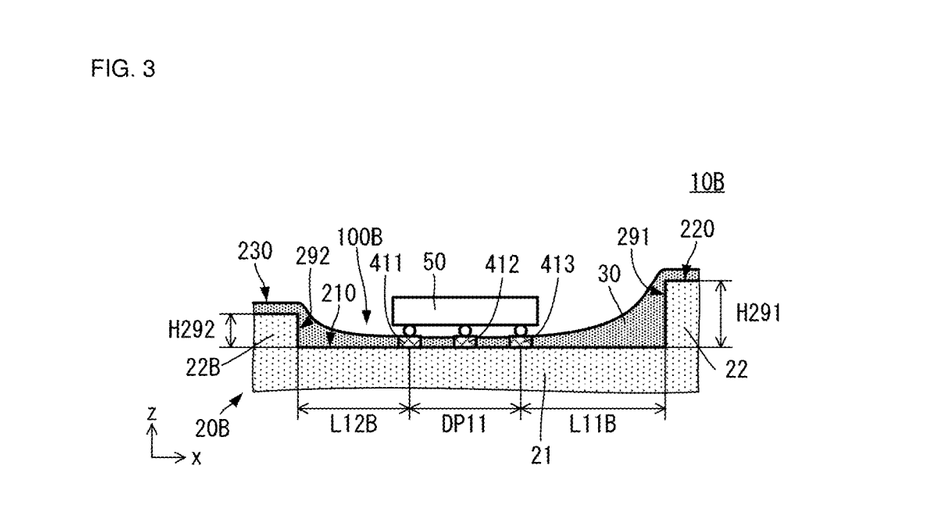
FIG. 3 is a partial side cross-sectional view of a circuit board according to a third preferred embodiment of the present invention.

A circuit board according to a third preferred embodiment of the present invention is described with reference to the drawing. FIG. 3 is a partial side cross-sectional view of the circuit board according to the third preferred embodiment.

As illustrated in FIG. 3, a circuit board 10B according to the third preferred embodiment differs from the circuit board 10A according to the second preferred embodiment in that it includes a cavity 100B in which the height H291 of the step surface 291 and the height H292 of the step surface 292 are different. The remaining configuration of the circuit board 10B is the same as or similar to that of the circuit board 10A, and the description of the same or similar portions is omitted.

In the circuit board 10B, the height H291 of the step surface 291 relating to the second section 22 in a substrate 20B is greater than the height H292 of the step surface 292 relating to a second section 22B. In this case, the separation distance L11B between the mounting electrode 413 and the step surface 291 is greater than the separation distance L12B between the mounting electrode 411 and the step surface 292.

When the height H291 of the step surface 291 is greater than the height H292 of the step surface 292, the height of the surface of the protective layer 30 at the first section 21 in the vicinity of the step surface 291 is greater than the height of the surface of the protective layer 30 in the vicinity of the step surface 292. Therefore, when the distance to the step surface 291 is greater than the distance to the step surface 292, the above-described defects in mounting can be further reduced or prevented. That is, when the separation distance is set in accordance with the height of the step surface while the separation distance not less than the terminal-to-terminal distance DP11 is provided, the circuit board 10B can further reduce or prevent defects in mounting.

Fourth Preferred Embodiment

Figure 4:
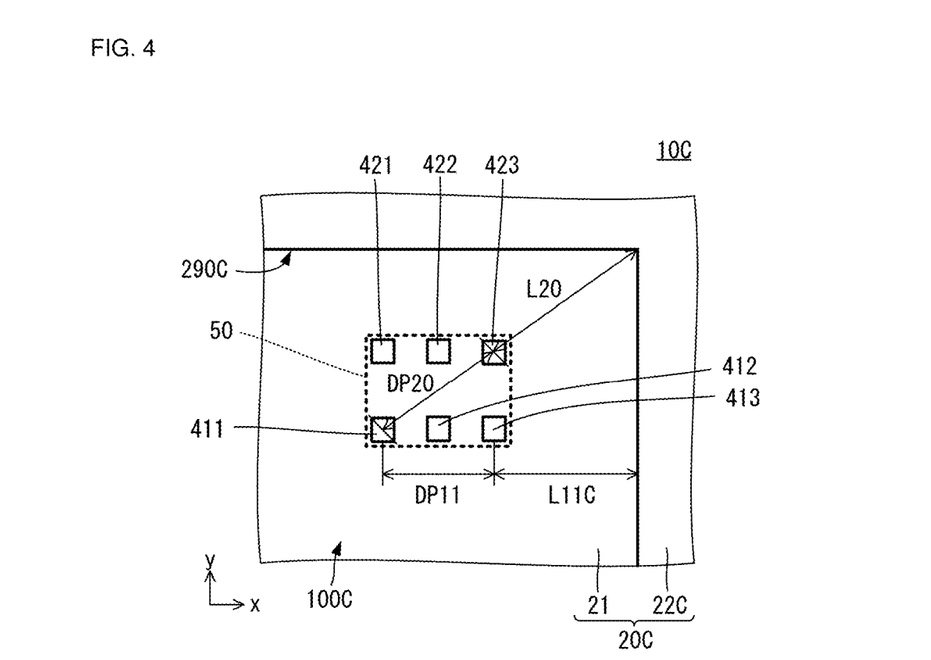
FIG. 4 is a partial plan view of a circuit board according to a fourth preferred embodiment of the present invention.

A circuit board according to a fourth preferred embodiment of the present invention is described with reference to the drawing. FIG. 4 is a partial plan view that schematically illustrates a configuration of the circuit board according to the fourth preferred embodiment.

As illustrated in FIG. 4, a circuit board 10C according to the fourth preferred embodiment differs from the circuit board 10 according to the first preferred embodiment in that it includes a substrate 20C including a cavity 100C. The remaining configuration of the circuit board 10C is the same as or similar to that of the circuit board 10, and the description of the same or similar portions is omitted.

The substrate 20C includes a step surface 290C. The step surface 290C includes a section extending in the x direction and a section extending in the y direction and includes a corner section connecting them.

The mounting electrodes 411 to 423 are provided in the vicinity of that corner section.

In this case, it is necessary to provide not only the separation distance L11C between the mounting electrode 413 and the step surface 290C but also the separation distance L20 between the mounting electrode 423, which is nearest the corner section, and the corner section.

Specifically, the separation distance L20 is greater than or equal to the terminal-to-terminal distance DP20 between the mounting electrode 411, which is farthest from the mounting electrode 423, and the mounting electrode 423. If the distance to an intersection point of the step surface 290C and an extension of a line connecting the mounting electrodes 411 and 423 to the step surface 290C is less than the distance to the corner section, the separation distance L20 may be the distance to that intersection point.

With this configuration, the circuit board 10C can further reduce or prevent the above-described defects in mounting, similar to the circuit board 10.

In addition, the separation distance between the mounting electrode 421 and the step surface 290C is longer than the terminal-to-terminal distance between the mounting electrodes 421 and 411 in the y direction in FIG. 4. Thus, the circuit board 10C can reduce or prevent the above-described defects in mounting.

Fifth Preferred Embodiment

Figure 5:
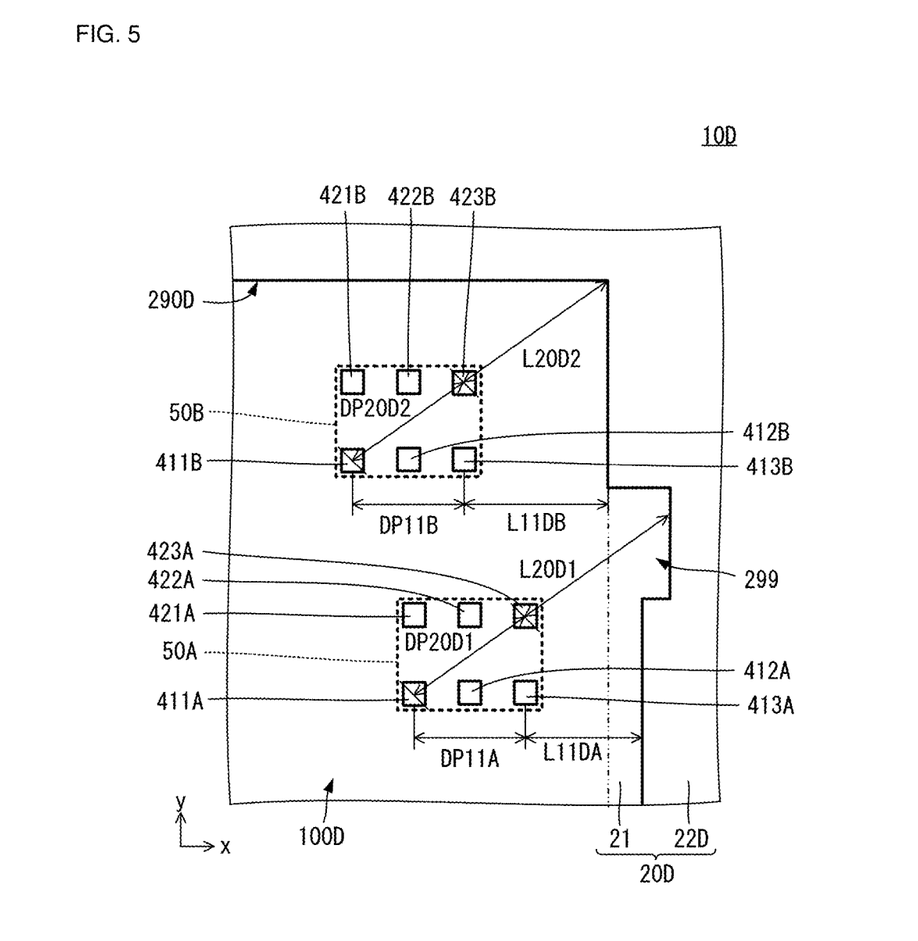
FIG. 5 is a partial plan view of a circuit board according to a fifth preferred embodiment of the present invention.

A circuit board according to a fifth preferred embodiment of the present invention is described with reference to the drawing. FIG. 5 is a partial plan view of the circuit board according to the fifth preferred embodiment.

As illustrated in FIG. 5, a circuit board 10D according to the fifth preferred embodiment differs from the circuit board 10C according to the fourth preferred embodiment in that it includes a cavity 100D on which a plurality of sets of pluralities of mounting electrodes, that is, a plurality of electronic components are mounted. The remaining configuration of the circuit board 10D is the same as or similar to that of the circuit board 10C, and the description of the same or similar portions is omitted.

A substrate 20D includes a step surface 290D. The substrate 20D includes a set of a plurality of mounting electrodes 411A to 423A and a set of a plurality of mounting electrodes 411B to 423B. An electronic component 50A is mounted on the plurality of mounting electrodes 411A to 423A. An electronic component 50B is mounted on the plurality of mounting electrodes 411B to 423B.

The set of the plurality of mounting electrodes 411A to 423A is nearer the section of the step surface 290D extending in the y direction (line indicated by the dash-dot-dot line, which does not include a receding section 299 of the step surface 290D, and by the solid line linearly connecting to that dash-dot-dot line) than the set of the plurality of mounting electrodes 411B to 423B.

For the plurality of mounting electrodes 411B to 423B, the separation distance L11DB between the mounting electrode 413B and the step surface 290D is greater than or equal to the terminal-to-terminal distance DP11B between the mounting electrodes 413B and 411B. The separation distance L20D2 between the mounting electrode 423B and the step surface 290D is greater than or equal to the terminal-to-terminal distance DP20D2 between the mounting electrodes 423B and 411B.

If the step surface 290D does not include the receding section 299, for the plurality of mounting electrodes 411A to 423A, the distance from the mounting electrode 413A to the dash-dot-dot line in FIG. 5 is less than the terminal-to-terminal distance DP11A between the mounting electrodes 413A and 411A. Similarly, the distance from the intersection point of the straight line connecting the mounting electrodes 423A and 411A and the dash-dot-dot line to the mounting electrode 423A is less than the terminal-to-terminal distance DP20D1 between the mounting electrodes 411A and 423A.

When the receding section 299 is present, however, the distance between the step surface 290D and the plurality of mounting electrodes 411A to 423A is increased. Thus, the separation distance L11DA between the mounting electrode 413A and the step surface 290D is greater than or equal to the terminal-to-terminal distance DP11A between the mounting electrodes 413A and 411A. The separation distance L20D1 from the intersection point of the straight line connecting the mounting electrodes 423A and 411A and the step surface 290D to the mounting electrode 423A can be greater than or equal to the terminal-to-terminal distance DP20D1 between the mounting electrodes 411A and 423A.

Therefore, in the case where the plurality of sets of the pluralities of mounting electrodes are provided, when each of the sets satisfies the above-described conditions of the relationship between the separation distance and the terminal-to-terminal distance, the circuit board 10D can reduce or prevent the above-described defects in mounting, similar to the above-described preferred embodiments.

Sixth Preferred Embodiment

Figure 6A:
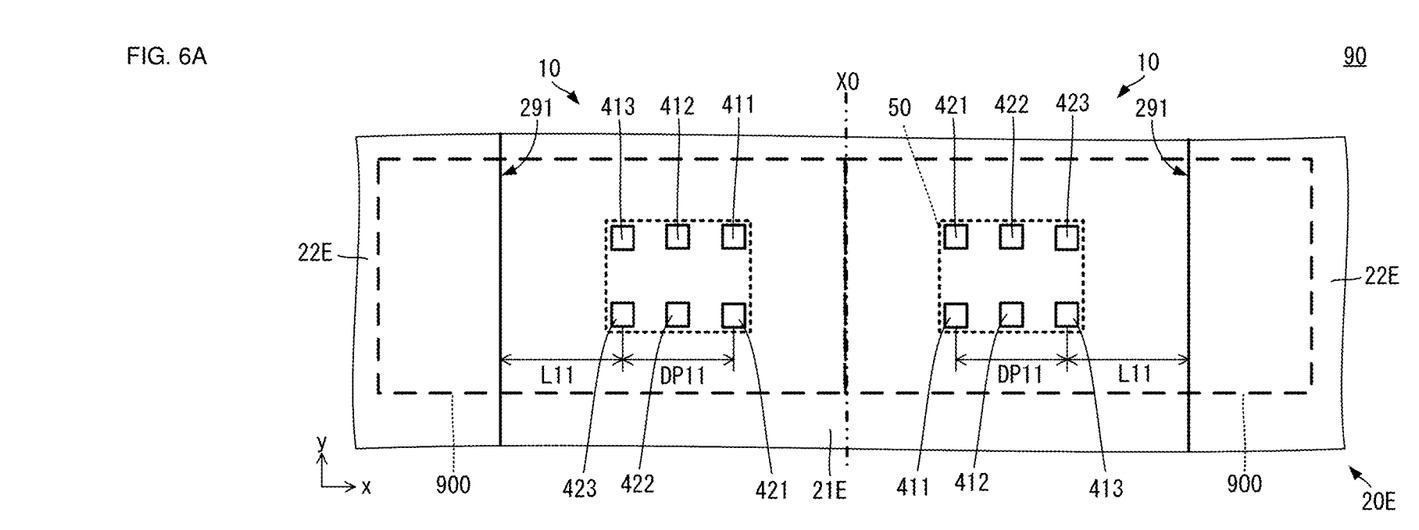
FIG. 6A is a partial plan view of a circuit board according to a sixth preferred embodiment.
Figure 6B:
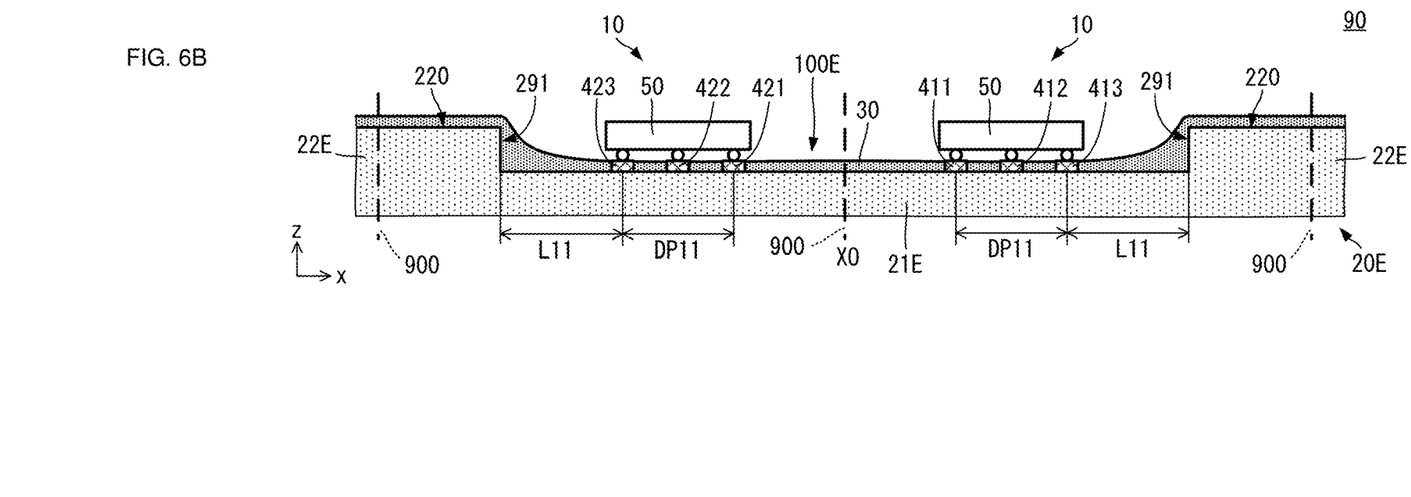
FIG. 6B is a partial side cross-sectional view of the circuit board according to the sixth preferred embodiment of the present invention.

A circuit board according to a sixth preferred embodiment of the present invention is described with reference to the drawings. FIG. 6A is a partial plan view of the circuit board according to the sixth preferred embodiment. FIG. 6B is a partial side cross-sectional view of the circuit board according to the sixth preferred embodiment.

As illustrated in FIGS. 6A and 6B, the circuit board according to the sixth preferred embodiment is a collective board including a plurality of circuit boards 10 described above. The configuration of each of the circuit boards 10 is the same as or similar to that of the circuit board 10 according to the first preferred embodiment. Accordingly, only points characteristic of the collective board 90 are specifically described below.

The collective board 90 includes a substrate 20E. The substrate 20E includes a first section 21E and two second sections 22E. The first section 21E has a shape in which the two first sections 21 described above are joined together along the x direction. A first one of the second sections 22E is connected to a first end of the first section 21E in the x direction. A second one of the second sections 22E is connected to a second end of the first section 21E in the x direction. In that configuration, the collective board 90 includes a cavity 100E whose bottom surface is the first section 21E.

The two sets of the pluralities of mounting electrodes 411 to 423 are arranged in the single cavity 100E and are spaced apart from each other along the x direction. The length of the cavity 100E in the x direction is the sum of the lengths of two products of the same or substantially the same shape. The two sets of the pluralities of mounting electrodes 411 to 423 are arranged at equal distances in the x direction from the center X0 of the cavity 100E in the x direction and are in locations sandwiching the center X0. The center X0 partially coincides with product outlines 900. The center X0 may not coincide with the product outlines 900.

In this configuration, the positional relationship between each set of the plurality of mounting electrodes 411 to 423 and the step surface 291 is described above, and in both of the sets, the separation distance L11 between the mounting electrode 413 and the step surface 291 is greater than or equal to the terminal-to-terminal distance DP11 between the mounting electrodes 413 and 411.

The product outlines 900 are lines used for individually cutting the circuit boards 10, and when that line is absent in actuality, a cut section indicates it. Each of the product outlines 900 includes a segment passing through the center or approximate center of the first section 21E in the x direction and extending in the y direction. The product outline 900 includes a segment extending in the y direction in the second section 22E. The product outline 900 further includes segments extending in the x direction and sandwiching the plurality of mounting electrodes 411 to 423 in the y direction.

By cutting the collective board 90 along the product outlines 900, the circuit boards 10 each having a rectangular or substantially rectangular shape as seen in plan view can be obtained.

In this way, when the above-described conditions of the relationship between the separation distance and the terminal-to-terminal distance are satisfied, the collective board 90 can reduce or prevent the above-described defects in mounting, similar to the above-described preferred embodiments.

With the configuration of the collective board 90, the plurality of circuit boards 10 can be efficiently arranged on the collective board 90 while the above-described defects in mounting can be reduced or prevented.

Seventh Preferred Embodiment

Figure 7A:
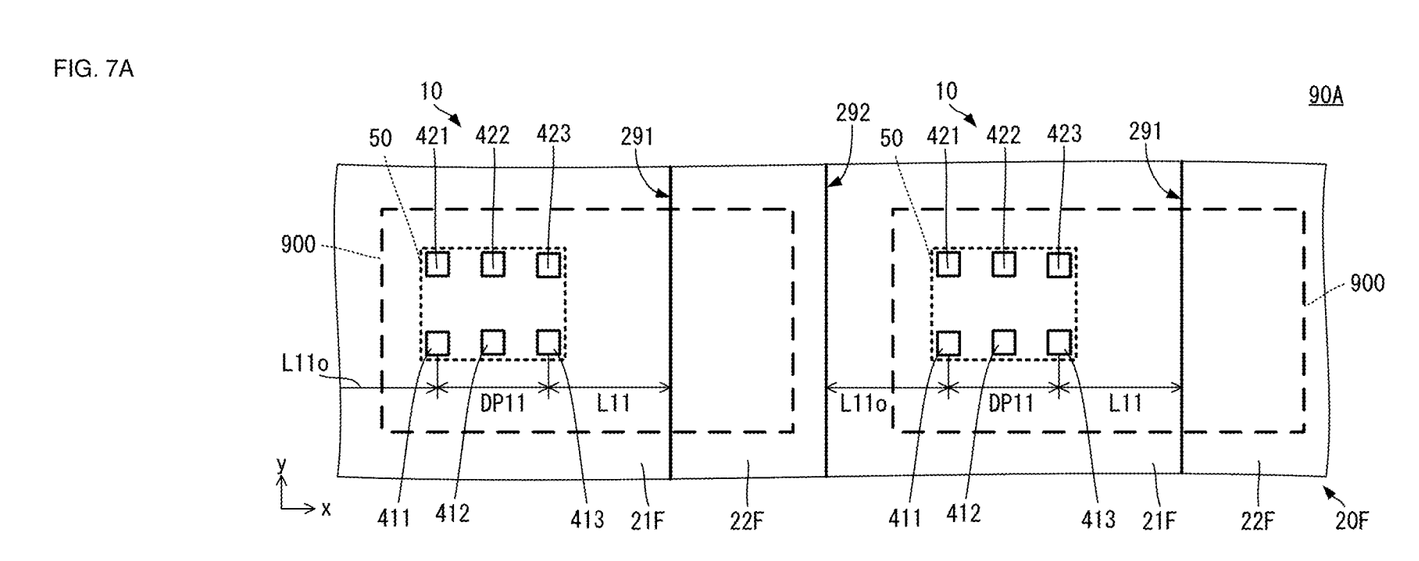
FIG. 7A is a partial plan view of a circuit board according to a seventh preferred embodiment of the present invention.
Figure 7B:
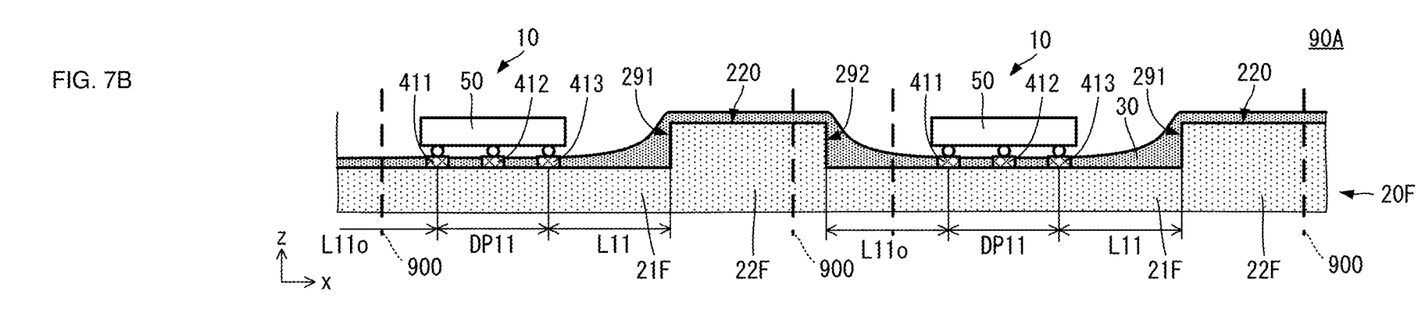
FIG. 7B is a partial side cross-sectional view of the circuit board according to the seventh preferred embodiment of the present invention.

A circuit board according to a seventh preferred embodiment of the present invention is described with reference to the drawings. FIG. 7A is a partial plan view of the circuit board according to the seventh preferred embodiment. FIG. 7B is a partial side cross-sectional view of the circuit board according to the seventh preferred embodiment.

As illustrated in FIGS. 7A and 7B, the circuit board according to the seventh preferred embodiment is a collective board, similar to the circuit board according to the sixth preferred embodiment. A collective board 90A according to the seventh preferred embodiment differs from the collective board 90 according to the sixth preferred embodiment in the arrangement of the circuit boards 10. The remaining configuration of the collective board 90A is the same as or similar to that of the collective board 90, and the description of the same or similar portions is omitted.

In the collective board 90A, the circuit boards 10 are arranged in the same orientation along the x direction. In this case, a substrate 20F includes first sections 21F and second sections 22F alternately arranged in the x direction.

In this configuration, the second section 22F is connected to not only an end portion of the first section 21F nearer the mounting electrode 413 but also an end portion thereof nearer the mounting electrode 411. It is, however, not necessary for each of the circuit boards 10 to include a step in the end portion of the first section 21F nearer the mounting electrode 411. Accordingly, the product outline 900 is set between the mounting electrode 411 and the second section 22F in the first section 21F. In other words, the second section 22F nearer the mounting electrode 411 is positioned outside the product of the circuit board 10. In this case, the position of the step surface 292 of the second section 22F can be set as appropriate such that the separation distance L110 between the mounting electrode 411 and the step surface 292 of the second section 22F positioned outside the product is greater than or equal to the terminal-to-terminal distance DP11 between the mounting electrodes 411 and 413. Thus, the collective board 90A can reduce or prevent the above-described defects in mounting, similar to the collective board 90 described above. When the step surface is positioned outside the product as described above, the defects in mounting can be reduced or prevented. Moreover, when the step surface is positioned outside the product, the position of the step surface is adjustable, and the above-described defects in mounting can be further reduced or prevented. When the step surface is positioned outside the product and the position of the step surface is adjustable, the size of the collective board 90 is adjustable. In other words, the number of the circuit boards 10 obtainable from the collective board 90 can be adjusted while the above-described defects in mounting are reduced or prevented. For example, as the separation distance L110 is decreased, the number of the obtainable circuit boards is increased.

Eighth Preferred Embodiment

Figure 8A:
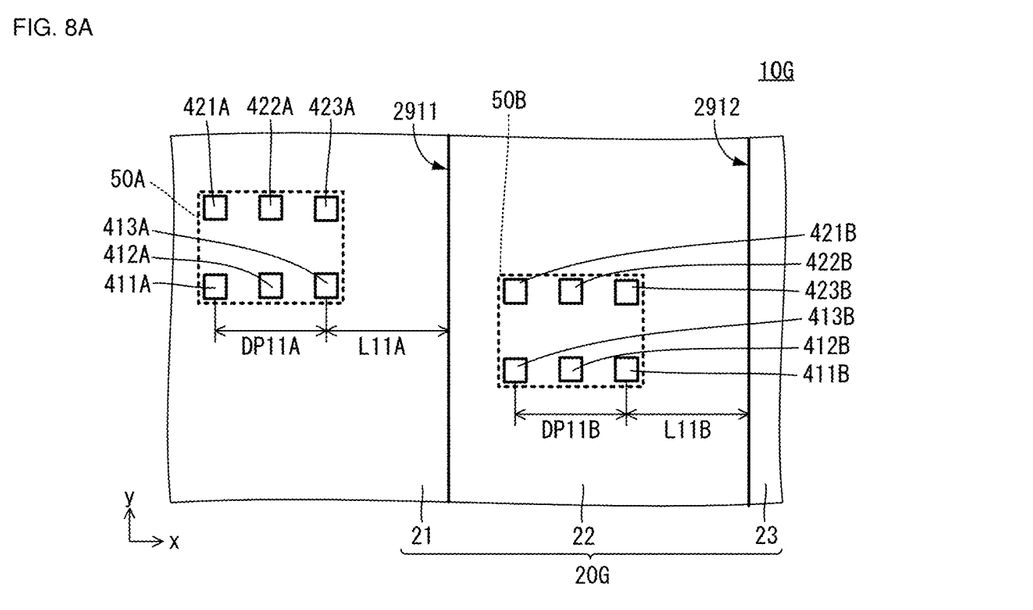
FIG. 8A is a partial plan view of a circuit board according to an eighth preferred embodiment of the present invention.
Figure 8B:
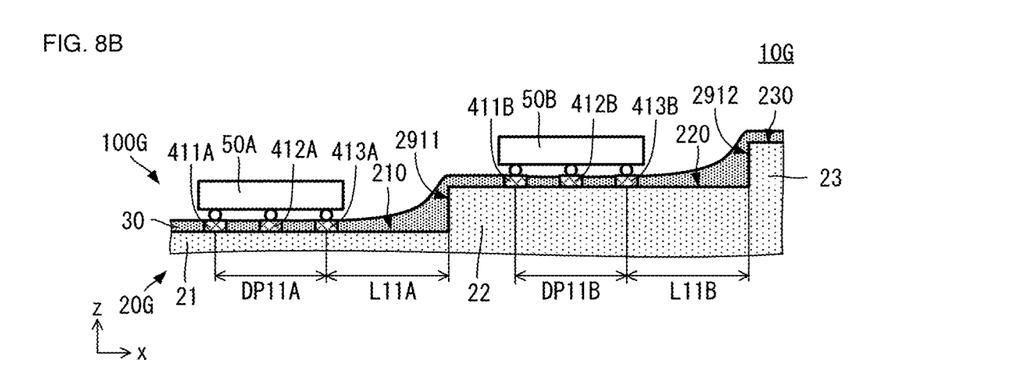
FIG. 8B is a partial side cross-sectional view of the circuit board according to the eighth preferred embodiment of the present invention.

A circuit board according to an eighth preferred embodiment of the present invention is described with reference to the drawings. FIG. 8A is a partial plan view of the circuit board according to the eighth preferred embodiment. FIG. 8B is a partial side cross-sectional view of the circuit board according to the eighth preferred embodiment.

As illustrated in FIGS. 8A and 8B, a circuit board 10G according to the eighth preferred embodiment differs from the circuit board 10 according to the first preferred embodiment in that it includes a cavity 100G. The remaining configuration of the circuit board 10G is the same as or similar to that of the circuit board 10, and the description of the same or similar portions is omitted.

The circuit board 10G includes a substrate 20G. The substrate 20G includes the first section 21, the second section 22, and a third section 23. The second section 22 is thicker than the first section 21. The third section 23 is thicker than the first section 21 and the second section 22. Thus, the first principal surface 220 of the second section 22 is higher than the first principal surface 210 of the first section 21, and a first principal surface 230 of the third section 23 is higher than the first principal surface 220 of the second section 22. A step surface 2911 (first step surface) connects the first principal surface 210 of the first section 21 and the first principal surface 220 of the second section 22. A step surface 2912 (second step surface) connects the first principal surface 220 of the second section 22 and the first principal surface 230 of the third section 23.

In this configuration, the circuit board 10G includes the cavity 100G with a two-stage cavity including a first bottom surface being the first principal surface 210 of the first section 21 and a second bottom surface being the first principal surface 220 of the second section 22.

The plurality of mounting electrodes 411A to 423A are disposed on the first principal surface 210 of the first section 21 (first bottom of the cavity 100G), and the plurality of mounting electrodes 411B to 423B are disposed on the first principal surface 220 of the second section 22 (second bottom of the cavity 100G).

The electronic component 50A is mounted on the plurality of mounting electrodes 411A to 423A, and the electronic component 50B is mounted on the plurality of mounting electrodes 411B to 423B. The electronic components 50A and 50B, which are illustrated as having the same or substantially the same shape in FIGS. 8A and 8B, may have different shapes.

In this configuration, the set of the plurality of mounting electrodes 411A to 423A satisfies the above-described conditions of the relationship between the separation distance L11A and the terminal-to-terminal distance DP11A for the step surface 2911. The set of the plurality of mounting electrodes 411B to 423B satisfies the above-described conditions of the relationship between the separation distance L11B and the terminal-to-terminal distance DP11B for the step surface 2912.

Thus, when the multistage cavity 100G is included, the circuit board 10G can reduce or prevent the above-described defects in mounting, similar to the above-described circuit board 10.

Furthermore, for the plurality of mounting electrodes 411A to 423A, the separation distance L11A is set in accordance with the height of the step surface 2911. For the plurality of mounting electrodes 411B to 423B, the separation distance L11B is set in accordance with the height of the step surface 2912. Thus, the circuit board 10G can further reduce or prevent the above-described defects in mounting.

When the separation distance between the plurality of mounting electrodes 411B to 423B disposed on the first principal surface 220 of the second section 22 and the step surface 2911 is less than the separation distance L11B from the step surface 2912, the circuit board 10G can be reduced in size or miniaturized.

The number of the mounting electrodes in the single set and the arrangement patterns described in the above-described preferred embodiments are examples, and when the above-described conditions of the relationship to the step surface are satisfied, any numbers and arrangement patterns can be supported.

The configurations in the above-described preferred embodiments can be combined as appropriate, and the operational advantages corresponding to each combination can be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
a substrate including an insulating material;
a plurality of mounting electrodes; and
a protective layer; wherein
the substrate includes:
a first section and a second section each including a first principal surface, positions of the first principal surfaces of the first and second sections being different in a thickness direction; and
a step surface provided by a difference between the position of the first principal surface of the first section and the position of the first principal surface of the second section in the thickness direction and exposed toward the first principal surface of the first section;
the plurality of mounting electrodes include a group of mounting electrodes to mount a component;
the group of mounting electrodes is provided on the first principal surface of the first section and correspond to an arrangement of terminals of the component;
the protective layer is disposed over the first principal surface of the first section, the step surface, and the first principal surface of the second section;
for two mounting electrodes of the group of mounting electrodes, a separation distance between one of the two mounting electrodes nearer the step surface and the step surface is greater than or equal to a distance between the two mounting electrodes;
the separation distance has a length greater than or equal to a height of the step surface;
the substrate is a collective board including a plurality of product portions, each of the plurality of product portions including a section on which the group of mounting electrodes on the first section is provided;
the step surface is positioned outside the product portion; and
in neighboring ones of the plurality of product portions, the first sections include portions continuous and flush with each other.

2. The circuit board according to claim 1, wherein
the substrate includes a third section different from the first section and the second section;
the substrate includes a step surface provided by a difference between the position of the first principal surface of the first section and a position of a first principal surface of the third section in the thickness direction, exposed toward the first principal surface of the first section, and relating to the third section;
the plurality of mounting electrodes includes a group of mounting electrodes on the first principal surface of the third section to mount a component;
the group of mounting electrodes disposed on the first principal surface of the third section is provided on the first principal surface of the first section corresponding to an arrangement of terminals of the component;
the protective layer is disposed over the step surface relating to the third section and the first principal surface of the third section; and
for two mounting electrodes in the group of mounting electrodes disposed on the first principal surface of the third section, a separation distance between one of the two mounting electrodes nearer the step surface relating to the third section and the step surface relating to the third section is greater than or equal to a distance between the two mounting electrodes.

3. The circuit board according to claim 1, wherein the substrate is a multilayer body in which insulating layers are laminated, and
the step surface is provided by a difference in the number of the insulating layers laminated.

4. The circuit board according to claim 1, further comprising a component including mounting terminals mounted on the group of mounting electrodes.

5. The circuit board according to claim 1, wherein
the two mounting electrodes in the group of mounting electrodes are a first mounting electrode nearest to the step surface and a second mounting electrode farthest from the first mounting electrode on a straight line between the first mounting electrode and the step surface; and
the separation distance between the first mounting electrode and the step surface is greater than or equal to a distance between the first mounting electrode and the second mounting electrode.

6. The circuit board according to claim 1, wherein the second section is thicker than the first section.

7. The circuit board according to claim 1, wherein the step surface is perpendicular or substantially perpendicular to the first surface of the first section and the first surface of the second section.

8. The circuit board according to claim 1, further comprising a cavity defined by the step surface and the first principal surface of the first section.

9. The circuit board according to claim 1, wherein the protective layer includes openings exposing the plurality of mounting electrodes.

10. A circuit board comprising:
a substrate including an insulating material;
a plurality of mounting electrodes; and
a protective layer; wherein
the substrate includes:
  a first section and a second section each including a first principal surface, positions of the first principal surfaces of the first and second sections being different in a thickness direction; and
  a step surface provided by a difference between the position of the first principal surface of the first section and the position of the first principal surface of the second section in the thickness direction and exposed toward the first principal surface of the first section;
the plurality of mounting electrodes include a group of mounting electrodes to mount a component;
the group of mounting electrodes is provided on the first principal surface of the first section and correspond to an arrangement of terminals of the component;
the protective layer is disposed over the first principal surface of the first section, the step surface, and the first principal surface of the second section;
for two mounting electrodes of the group of mounting electrodes, a separation distance between one of the two mounting electrodes nearer the step surface and the step surface is greater than or equal to a distance between the two mounting electrodes;
the separation distance has a length greater than or equal to a height of the step surface;
the step surface includes a first step surface and a second step surface lower than the first step surface; and
a separation distance from the first step surface is greater than a separation distance from the second step surface.

11. The circuit board according to claim 10, wherein the substrate includes a third section different from the first section and the second section;
the substrate includes a step surface provided by a difference between the position of the first principal surface of the first section and a position of a first principal surface of the third section in the thickness direction, exposed toward the first principal surface of the first section, and relating to the third section;
the plurality of mounting electrodes includes a group of mounting electrodes on the first principal surface of the third section to mount a component;
the group of mounting electrodes disposed on the first principal surface of the third section is provided on the first principal surface of the first section corresponding to an arrangement of terminals of the component;
the protective layer is disposed over the step surface relating to the third section and the first principal surface of the third section; and
for two mounting electrodes in the group of mounting electrodes disposed on the first principal surface of the third section, a separation distance between one of the two mounting electrodes nearer the step surface relating to the third section and the step surface relating to the third section is greater than or equal to a distance between the two mounting electrodes.

12. The circuit board according to claim 10, wherein the substrate is a multilayer body in which insulating layers are laminated, and
the step surface is provided by a difference in the number of the insulating layers laminated.

13. The circuit board according to claim 10, further comprising a component including mounting terminals mounted on the group of mounting electrodes.

14. The circuit board according to claim 10, wherein
the two mounting electrodes in the group of mounting electrodes are a first mounting electrode nearest to the step surface and a second mounting electrode farthest from the first mounting electrode on a straight line between the first mounting electrode and the step surface; and
the separation distance between the first mounting electrode and the step surface is greater than or equal to a distance between the first mounting electrode and the second mounting electrode.

15. The circuit board according to claim 10, wherein the second section is thicker than the first section.

16. The circuit board according to claim 10, wherein the step surface is perpendicular or substantially perpendicular to the first surface of the first section and the first surface of the second section.

17. The circuit board according to claim 10, further comprising a cavity defined by the step surface and the first principal surface of the first section.

18. The circuit board according to claim 10, wherein the protective layer includes openings exposing the plurality of mounting electrodes.

* * * * *